(12) United States Patent
Williams

(10) Patent No.: US 8,908,538 B1
(45) Date of Patent: Dec. 9, 2014

(54) IMPAIRMENT DISCOVERY USING AUTOMATIC GEOGRAPHICAL CLUSTERING

(75) Inventor: Thomas Williams, Longmont, CO (US)

(73) Assignee: ARRIS Enterprises, Inc., Suwanee, GA (US)

( * ) Notice: Subject to any disclaimer, the term of this patent is extended or adjusted under 35 U.S.C. 154(b) by 367 days.

(21) Appl. No.: 13/077,558

(22) Filed: Mar. 31, 2011

Related U.S. Application Data

(60) Provisional application No. 61/319,409, filed on Mar. 31, 2010.

(51) Int. Cl.
*H04L 12/28* (2006.01)
*H04N 7/173* (2011.01)
*G09G 5/00* (2006.01)
*G06F 15/173* (2006.01)
*G01R 31/02* (2006.01)
*G01R 13/02* (2006.01)

(52) U.S. Cl.
CPC ............. *G01R 31/02* (2013.01); *G01R 13/02* (2013.01)
USPC .......... 370/245; 370/252; 725/127; 725/129; 345/643; 709/224

(58) Field of Classification Search
CPC . B82Y 10/00; G09G 2340/125; G09G 5/395; G06T 11/40; G06T 15/005; H04H 20/69; H04J 14/0226; H04L 12/433; H04L 12/437; H04L 12/2602; H04L 12/2697; H04L 25/02; H04L 29/06; H04L 29/08072; H04L 43/00; H04L 43/50; H04L 43/0852; H04L 41/06; H04L 41/22; H04L 45/28; H04L 47/10; H04N 7/22; H04N 7/102; H04N 7/17309; H04N 21/6118; H04N 7/104
USPC ...................... 370/241, 241.1, 244, 245, 252; 348/180, 192; 725/107, 109–118, 129, 725/127; 709/227, 228, 229, 224; 714/704, 714/712, 746, 798, 799; 375/211; 455/7, 455/26.1, 39; 345/643
See application file for complete search history.

(56) References Cited

U.S. PATENT DOCUMENTS

| | | | |
|---|---|---|---|
| 6,782,884 B1 * | 8/2004 | Chen et al. | 725/111 |
| 2004/0034871 A1 * | 2/2004 | Lu et al. | 725/111 |
| 2005/0078660 A1 * | 4/2005 | Wood | 370/352 |
| 2005/0144648 A1 * | 6/2005 | Gotwals et al. | 725/111 |
| 2005/0204397 A1 * | 9/2005 | Miyazoe et al. | 725/107 |
| 2007/0121712 A1 * | 5/2007 | Okamoto | 375/222 |
| 2007/0150444 A1 * | 6/2007 | Chesnais et al. | 707/3 |
| 2009/0172511 A1 * | 7/2009 | Decherd et al. | 715/207 |

* cited by examiner

*Primary Examiner* — Alpus H Hsu
*Assistant Examiner* — Dharmesh Patel
(74) *Attorney, Agent, or Firm* — Troy A. Van Aacken

(57) ABSTRACT

Systems and methods can provide for improved impairment discovery for broadband communication systems. In some implementations, such systems and methods can provide cluster outage detection and/or time-stamped outage data and visualization. Improved outage discovery can help operators plan repair and thereby reduce truck rolls and decrease network down-time.

20 Claims, 6 Drawing Sheets

IMPAIRMENT DISCOVERY USING AUTOMATIC GEOGRAPHICAL CLUSTERING

TECHNICAL FIELD

This application is a non-provisional application claiming the benefit of U.S. Provisional Application Ser. No. 61/319,409, entitled "Impairment Discovery Using Automatic Geographical Clustering," filed Mar. 31, 2010, which is hereby incorporated by reference in its entirety.

TECHNICAL FIELD

This disclosure relates to discovery of network impairments, including outages.

BACKGROUND

Impairment discovery is increasingly problematic as cable infrastructure becomes more ubiquitous. Network impairments can cause noisy or blocky TV pictures, unintelligible telephone conversations, slow web page downloads, or impaired 2-way communications. Outages are one of several types of impairments. Other types of impairments are high transmit level, low receive level, low modulation error rate (MER), continuous wave interference, and non-linear and linear distortions.

Currently, the most popular cable architecture is a hybrid fiber coax (HFC) architecture. An HFC architecture can employ fiber optic cable for the long distance from a hub (or headend) site to a node. A hub site is a source point for downstream signals and a destination point for upstream signals. A node is a grouping of approximately 500 homes. Inside a node the signals are distributed via coaxial cable to a terminal device, which is typically located inside a home, apartment, or office. A terminal device can be a cable modem (CM), multimedia terminal adapter (MTA), set-top box (STB), or gateway device. A coaxial portion of the cable plant is built with a tree-and-branch architecture, so an impairment on a branch can potentially affect multiple subscribers.

Impairments can be discovered using a network monitoring software, which communicate with the subscriber's equipment. One current method to find impairments is to provide a connectivity database where a list of terminal devices attached to each branch is supplied. When an impairment occurs, a defective branch can be located using a list of affected customers. However, connectivity databases can be costly to maintain and are frequently out-of-date.

Another method to find impairments uses colored pins on a map to identify subscribers without service. Cable operator databases show addresses for subscribers and can also show latitude and longitude coordinates. If a number of colored pins are noticed to form a cluster, an impairment can be declared. However, this method requires operators to stick the pins into a map and visually identify an impairment. Random isolated outages are generally ignored because they can be caused by a subscriber unplugging the terminal equipment to save electricity.

BRIEF DESCRIPTION OF THE DRAWINGS

Like reference numbers and designations in the various drawings indicate like elements.

DETAILED DESCRIPTION

Figure 1:
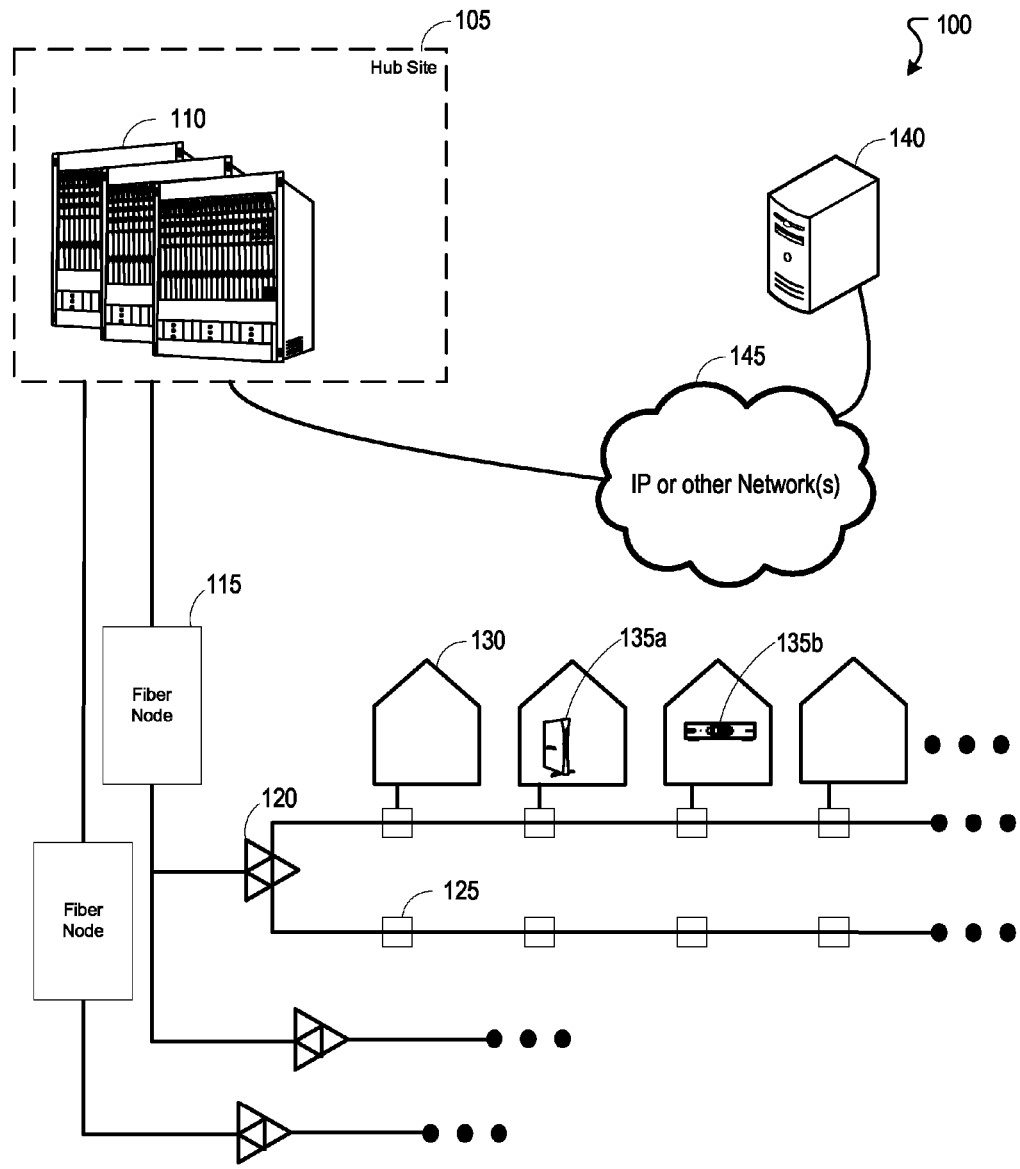
FIG. 1 is a block diagram of a simplified bi-directional hybrid fiber coax system employing the tree and branch architecture.

In some implementations of this disclosure, systems and methods can operate to improve impairment discovery. Impairment discovery can improve detection methods and/or visualization of impairment data and decrease impairment duration, thereby increasing customer satisfaction with network performance. In some implementations, improved impairment discovery can operate to implement cluster outage detection. A cluster can be a group of geographically nearby devices. Cluster outage detection can be based on calculating the sum of weighted factors of geographically nearby terminal devices to accurately and efficiently identify an impairment. In some implementations, improved impairment discovery can also operate to implement time-stamped impairment data and visualization. Time-stamped impairment data can be collected from terminal devices and displayed to enable an operator to efficiently discover impairments and thereby reduce truck rolls.

Cluster impairment detection can improve many inefficient and/or ineffective methods of distinguishing genuine service outages from false outages caused by powered down terminal devices. Moreover, cluster outage detection can more efficiently compute and identify, based upon a programmable threshold, the location and time a cluster outage has occurred. In some implementations, cluster outage detection can use the latitude and longitude coordinates of a terminal device to calculate Euclidean distances between a terminal device and its neighbor(s). In other implementations, methods such as, for example, house address calculations, can be used to determine coordinates can be used to calculate terminal device distances.

In some implementations, a weighted factor can be a function of the calculated distances and pre-calculated value. For example, the weighted score can be calculated by multiplying the calculated distances by a pre-calculated value, which can be based upon the closeness to the neighbor. The pre-calculated value can be based on elements such as, for example, population density or type of residence (e.g., apartment complex, etc.). In other examples, other mathematical operations can be used to define the function. In additional implementations, the weighted score can be generated dynamically. For example, each time a new outage is identified or an existing outage is eliminated, new weighted scores for each of the subscribers can be generated.

When an impairment occurs, the weighted scores in a cluster can be summed into a cluster sum. If the cluster sum is greater than a threshold value, then the cluster can be identified to have experienced an outage. In some implementations, a cluster can be a predetermined geographic area and/or a group of subscribers within a specific distance or numeric threshold. In other implementations, a cluster can be determined as subscribers attached to a hub site, fiber node, and/or amplifier. In some implementations, the threshold can be a preconfigured value. In other implementations, the threshold can be a dynamically generated value. An example of a dynamically generated threshold is a threshold that can increase or decrease based on the number of determined subscribers or outages in the area. For example, a dynamic threshold can decrease in denser areas to compensate for smaller geographic differences between users.

Time-stamped impairment data and visualization can operate to enable operators to more efficiently and effectively diagnose outages. The data can be displayed with time-stamped information to enable operators to visualize the time progression of outages and thus improve efficiency and accuracy. Moreover, the time-stamped data can enable the operator to observe time-accelerated data over a compressed period of time. In addition to outages, the other diagnostic data obtained can be displayed such as, for example, modulation error ratio (MER), forward error correction (FEC), power level, receive signal, and/or flapping. In some implementations, the data can be selected by a visual button on the display.

Operators can gain insight into the type of outage by determining the types of subscriber equipment that are having impairments. For example, outages that affect CMs and STBs but not MTAs can indicate neighborhood power loss. In another example, outages that affect CMs, MTAs and STBs can indicate a cable line failure. In still further examples, outages that affect both CMs and MTAs, or only STBs, can indicate network controller failures (i.e. a cable model termination system (CMTS)). In another example, during a power outage, a CM or STB in the middle of the outage area that remains "on-line" can be determined to not be located at the indicated address. Thus, an outage can potentially be used for fraud detection.

In some implementations, an impairment time-stamped map can be used to improve outage discovery. In another implementation, a service degradation time line map can be used to discover and/or diagnose other network problems. In addition to the outage time map, impairments such as transmit power level, input signal level, and SNR, among others, can degrade over time. In this implementation, the time scale would be months. Moreover, a check box can allow a selection of parameters to be viewed. In some implementations, the wheel on a mouse can be used to control the time-line. Alternatively, the time-line can be controlled by a progress bar that can be advanced forward and backward to view the progression of a service status over time. In still further implementations, a directed polling time-stamped map can be implemented to improve outage discovery.

In some implementations, the time-stamp can be obtained from the terminal device. In other implementations, the time-stamp can be obtained from another source such as, for example, the computer device implementing the outage discovery or a headend device. In additional implementations, the time acceleration can compress hours or days to seconds. In still further implementations, the time acceleration compression can be a programmable input by the operator.

FIG. 1 is a block diagram of a simplified bi-directional hybrid fiber coax system employing the tree and branch architecture. The system 100 can include a hub site 105 with one or more CMTS 110. The hub site 105 and CTMS 110 can provide one or more fiber nodes 115. The fiber nodes can extend network services to many geographically dispersed operators with trunk radio-frequency (RF) amplifiers 120. The amplifiers can provide data by extending taps 125 to an end user at the home 130, apartment, and/or office. Terminal devices 135a-b typically reside inside the home and can be, for example, cable modems (CMs) 135a, multimedia terminal adapters (MTAs), set-top boxes (STBs) 135b, or gateway devices.

The terminal devices 135a-b can communicate with a computing device 140 or other broadband communication device that is operable to implement improved outage discovery. In some implementations, the computer device can be a server or other network device with programmable capability such as, for example, a programmable router, network switch, a centralized computer, or personal digital assistant (PDA). The computing device 140 can be connected to the terminal devices over a network infrastructure 145 (e.g., the internet). In some implementations, the communication can occur over a variety other networks and or combinations of networks such as, for example, an 802.11-type connection, ATM, IP, or other network.

Figure 2:
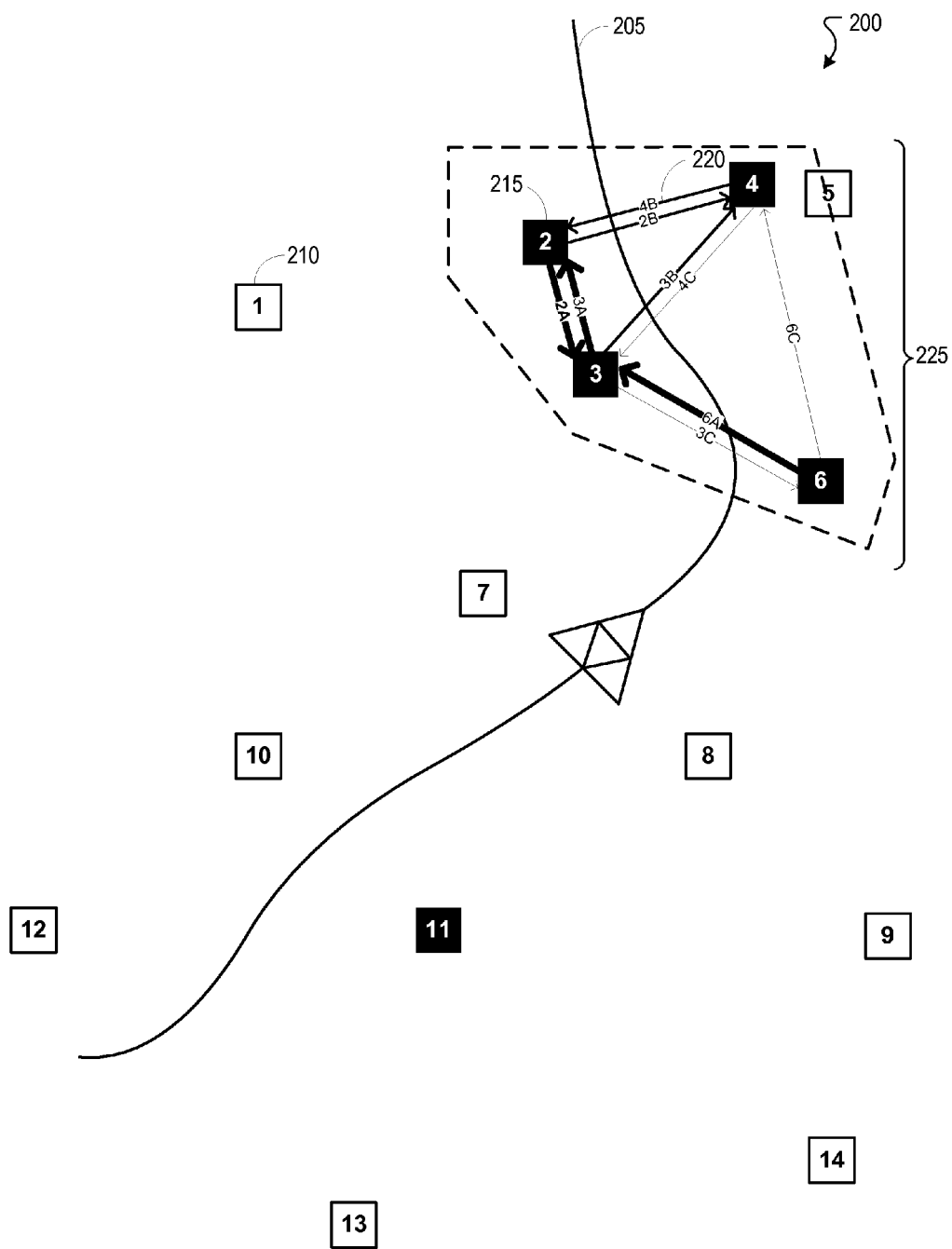
FIG. 2 is a block diagram illustrating cluster impairment detection.

FIG. 2 is a block diagram illustrating cluster impairment detection. In some implementations, a cluster can be specified as a group of terminal devices associated with a geographic location such as, for example, a street 205. In the block diagram, terminal devices (e.g., terminal device 135a-b of FIG. 1) are represented as blocks 210, containing a highlighted number, to distinguish between terminal devices. Alternatively, a block can also represent a subscriber (e.g., home 130 of FIG. 1), apartment, or office.

A white block with a black highlighted number 210 can be represented as an active terminal with associated latitude and longitude coordinates. A black block with a white highlighted number 215 can be represented as a terminal experiencing an outage. The weighted factor 220 can be represented as a solid black arrow pointing from the source weighting terminal experiencing an outage to the destination weighting terminal experiencing an outage. Thicker arrows represent a higher relative weighting due to proximity.

For example, in an instance of calculating the weighted factors for three closest neighbors, terminal 3's closest neighbors are terminal 2, terminal 4, and terminal 6, respectively. Moreover, for terminal 3, the outage weighted score can be higher for outages from terminal 3 to terminal 2 (3A), lower for terminal 3 to terminal 4 (3B), and lowest for outages from terminal 3 to terminal 6 (3C). It should be understood that rank can differ based on the perspective of the source terminal and destination terminals. For example, although terminal 4 can be the second closest from terminal 3's perspective (3B), terminal 3 can be the third closest from terminal 4's perspective (4C). In addition, weighted factors can be omitted when closest neighbors are not experiencing an outage. For example, the weighted factor for terminal 2 to terminal 5 can be omitted because terminal 5 does not show an outage. In some implementations, the weighted factors can be summed together to calculate the cluster sum. In other implementations, the redundant-count weighted factors can be included and/or omitted.

When weighted factors are summed together to compute a cluster sum greater than a threshold, the cluster can be considered a cluster outage 225 and can be represented as a geographic area with many device terminal outages. In some implementations, a cluster outrage can be terminal devices connected to a RF amplifier (e.g., RF amplifier 120 of FIG. 1). In other implementations, a cluster outage can be terminal devices connected to a fiber node (e.g., fiber node 115 of FIG. 1). It should be understood that a map is not required to implement cluster outage detection and that outage detection is done automatically without the need to render any map.

Figure 3:
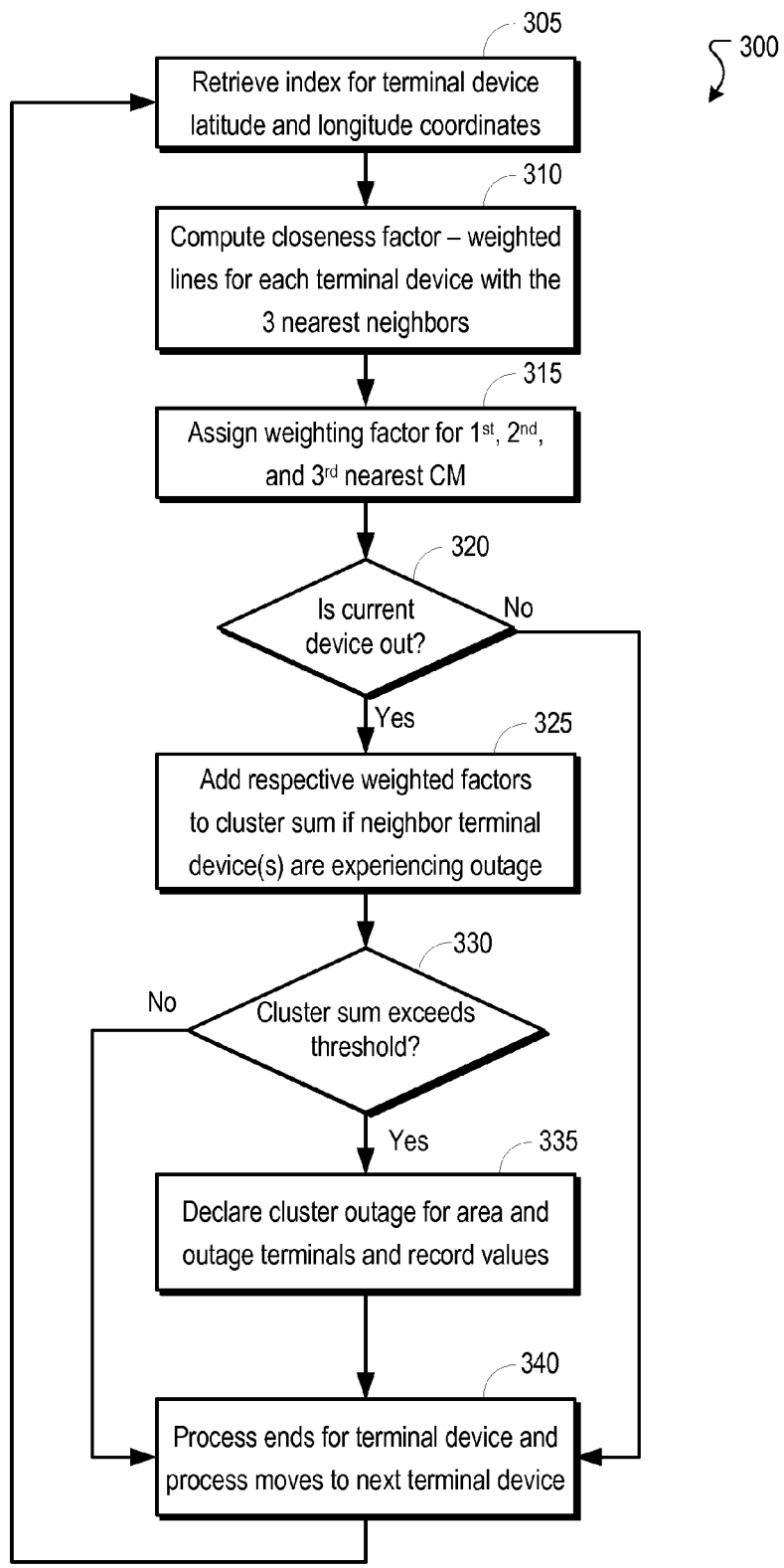
FIG. 3 is a flowchart illustrating an example process operable to provide cluster impairment detection.

FIG. 3 is a flowchart illustrating an example process operable to provide cluster impairment detection. The process 300 can begin at stage 305 when a computer device retrieves and/or inputs an index for a terminal device with latitude and longitude coordinates. The computer device (e.g., computing device 140 of FIG. 1) can retrieve the coordinates of the terminal device (e.g., terminal device 135*a-b* of FIG. 1 and block 210 of FIG. 2) using the network (e.g., IP or other Network(s) 145 of FIG. 1). In some implementations, the coordinates can be preconfigured. In other implementations, the coordinates can be obtained from an external source via an interface such as, for example, an external server (e.g., a geolocation server) and dynamically updated. In still further implementations, the coordinates can be entered into the computer device manually by an operator.

In some implementations, the computer device can input a batch of subscriber addresses on a node-by-node or cluster-by-cluster basis into a geocoder to generate the latitude and longitude coordinates. In other implementations, a status generator that contains the latitude and longitude and response status of each device can be used. In alternative implementations, the computer device can use other information to identify the location of the terminal device instead of latitude and longitude coordinates.

At stage 310, the computer device calculates the closeness factor of the terminal device. The computer device (e.g., computing device 140 of FIG. 1) computes the closeness factor using a proximity function. For example, the proximity function can perform mathematical operations on latitude and longitude coordinates for terminal devices (e.g., terminal device 135*a-b* of FIG. 1 and block 210 of FIG. 2) geographically near (i.e., nearest neighbors) to other terminal devices. In some implementations, the number of nearest neighbors to be computed can be three. In other implementations, the number can be programmable by the system operator to be any whole number. In some implementations, the distance can be calculated by performing a subtraction operation to calculate the Euclidian distance between terminal devices. In other implementations, another function can be used to calculate another relative distance between terminal devices.

At stage 315, the computer device calculates the weighted factor between a terminal device and its nearest neighbors. The computer device (e.g., computing device 140 of FIG. 1) can multiply the computed distance to obtain a weighted factor (e.g., weighted factor 220 of FIG. 2). The weighted factor improves outage discovery by accounting for sparse or dense areas of terminal devices. It should be understood that weighted factors and nearest neighbors can be different for terminal devices. In some implementations, the weighted factor can be a fixed value dependent on the nearness of the terminal device to its nearest neighbor. In other implementations, the factor can be a changed dynamically based upon variables such as, for example, current outage frequencies or terminal device density.

At stage 320, a determination can be made whether the current terminal device has experienced an outage. The determination can be made, for example, by the computer device (e.g., computing device 140 of FIG. 1) polling the terminal device (e.g., terminal device 135*a-b* of FIG. 1 and block 210 of FIG. 2) through the network (e.g., IP or other Network(s) 145 of FIG. 1). In some implementations, a terminal device outage also can be calculated by other input methods.

If the terminal device has not experienced an outage at stage 320, then at stage 340, the process for the current terminal device can end and the process can move recursively to the next terminal device. The determination can be made, for example, by the computer device (e.g., computing device 140 of FIG. 1) polling the terminal device (e.g., terminal device 135*a-b* of FIG. 1 and block 210 of FIG. 2) through the network (e.g., IP or other Network(s) 145 of FIG. 1). In some implementations, the process would not end, but can enter a record into a database signifying that the terminal device has not experienced an outage. In other implementations, the process 300 can end following this step.

If the terminal device has experienced an outage at stage 320, then at stage 325 respective weighted factors are added to cluster sum if nearest neighbors are experiencing an outage. The determination can be made, for example, by the computer device (e.g., computing device 140 of FIG. 1) polling the terminal device (e.g., terminal device 135*a-b* of FIG. 1 and block 210 of FIG. 2) through the network (e.g., IP or other Network(s) 145 of FIG. 1). In other implementations, the number of nearest neighbors added can be another preset or programmable number of nearest neighbor weighted factors. In some implementations, the mathematical operation can be a variation of addition or another mathematical operation.

At stage 330, a determination can be made whether the cluster sum exceeds a threshold for a plurality of terminal devices. The determination of the cluster sum can be a running sum of weighted factors (e.g., weighted factor 220 of FIG. 2) and can be computed, for example, by the computer device (e.g., computing device 140 of FIG. 1). In some implementations, the determination can be made manually by an operator. In other implementations, the determination can be made automatically by the cluster outage detection program located in another networked device.

If the sum of weighted factors does not exceed the threshold at stage 330, then at stage 340 the process for the current terminal device and the process moves recursively to the next terminal device. The cluster sum of weighted factors (e.g., weighted factor 220 of FIG. 2) and the generating of a terminal device (e.g., terminal device 135*a-b* of FIG. 1 and block 210 of FIG. 2) cluster list can be performed by the computer device (e.g., computing device 140 of FIG. 1). In some implementations, the process would not end, but can enter into a database the record that the terminal as not experiencing an outage. In other implementations, the process can end process 300.

If the cluster sum of weighted factors does exceed the threshold at stage 330, then at stage 335 the cluster can be declared by the computer device as experiencing a cluster outage and the cluster list can be generated with information of device terminal outages and record values. The cluster sum of weighted factors (e.g., weighted factor 220 of FIG. 2) and the generating of a terminal device (e.g., terminal device 135*a-b* of FIG. 1 and block 210 of FIG. 2) cluster list can be performed by the computer device (e.g., computing device 140 of FIG. 1). In some implementations, the process does not end, but continuously calculates and prioritizes cluster outages. At stage 340, the process for the current terminal device can end and the process can move recursively to the next terminal device.

Figure 4:
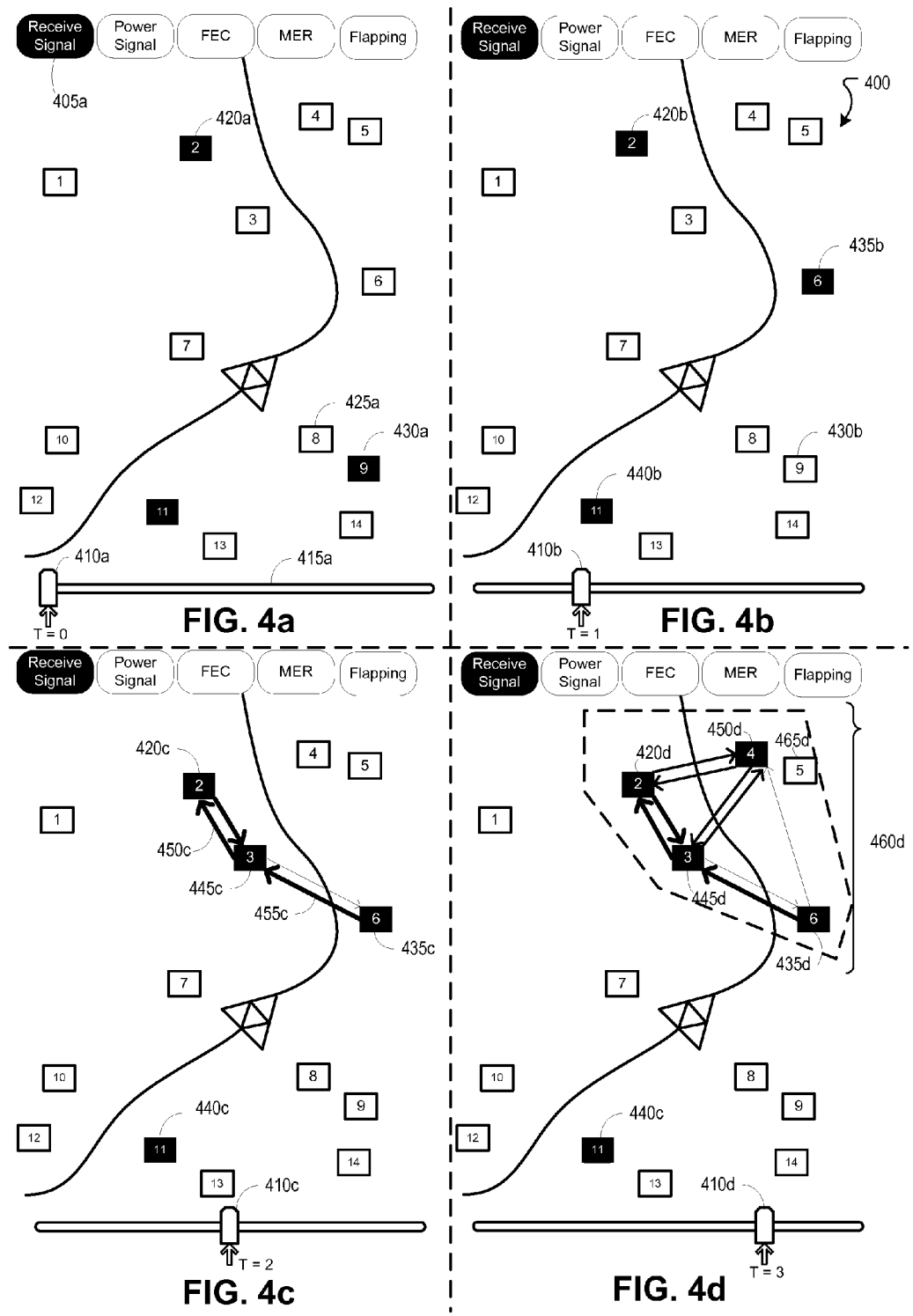
FIGS. 4*a*-*d* are block diagrams illustrating time-stamped impairment data and visualization.

FIGS. 4*a-d* are block diagrams illustrating time-stamped impairment data and visualization. In addition to time-stamped outage data, diagnostic information such as, for example, service degradation time-stamped map or directed polling time-stamped map can be implemented to improve outage discovery. FIG. 4*a* displays the Receive Signal 405*a* to determine outages on a graphical map at time, T=0, 410*a*. In some implementations, other diagnostic data can be displayed such as, for example, modulation error ratio (MER), forward error correction (FEC), power level, receive signal, and/or flapping, among others. The data can be selected by pressing a graphical button 405*a* or another input method such as, for example, selecting a matrix of values split by columns. In some implementations, the time scale can be in increments of minutes. In other implementations, the time scale can be increments of hours. In still further implementations, the time scale can be in increments of days or any other defined time scale. The time can be manipulated by an operator with a time-compressed progress bar 415a. In some implementations, the time-compressed progress bar 415a can be manipulated with a mouse wheel or mouse clicks. In other implementations, the time-compressed progress bar can be manipulated with keyboard strokes.

In the block diagram, terminal devices (e.g., terminal device 135a-b of FIG. 1 and block 210 of FIG. 2) can be represented as blocks 420a, containing a number, to represent distinguish between terminal devices. A white block with a black highlighted number 425a can be represented as an active terminal. A black block with a white highlighted number 420a can be represented as a terminal device experiencing an outage. In some implementations, the terminal outages and/or an associated status can be represented as another shape or color.

In FIG. 4a, at time T=0 410a, terminal devices (e.g., terminal device 135a-b of FIG. 1 and block 210 of FIG. 2) "2" 420a and "9" 430a can be displayed as experiencing an outage, while other terminal devices can be displayed as active. In this example, the diagram can display no weighted factor, since the nearest three neighbors can be summed in a cluster for outage purpose. The time-stamped data can help operators diagnose the type and duration of impairments over time.

In FIG. 4b, at time T=1 410b, terminal devices (e.g., terminal device 135a-b of FIG. 1 and block 210 of FIG. 2) "2" 420b, "6" 435b, and "11" 440b can be displayed as experiencing an outage, while other terminal devices can be displayed as active. At time T=1 405b, terminal device "9" 430b has changed from outage to active. In some implementations, the operator can diagnose that terminal device outages can be attributed to STBs or CMs that can be powered off thereby leading to a diagnosis that no cluster outage needs to be declared.

In FIG. 4c, at time T=2 405c, terminal devices (e.g., terminal device 135a-b of FIG. 1 and block 210 of FIG. 2) "2" 420c, "6" 435c, "11" 440c, and "3" 440c can be displayed as experiencing an outage, while other terminal devices can be displayed as active. Because a group of terminal devices outages (e.g., "2" 420c, "6" 435c, and "3" 440c) can be within the third nearest neighbor, the weighted factor lines (e.g., weighted factor 220 of FIG. 2) 450c/455c can be displayed between near terminal devices experiencing outages. In some implementations, the weighted factor lines can be calculated for another configurable number of nearest neighbors. It should be understood that weighted factors can be calculated from the perspective of each terminal device. An operator can diagnose that a cluster outage can occur in the group of terminal outages (e.g., "2" 420c, "6" 435c, and "3" 445c), while diagnosing that outage "11" 440c can be caused by a powered off terminal device or other lower priority outage.

In FIG. 4d, at time T=3 410d, terminal devices (e.g., terminal device 135a-b of FIG. 1 and block 210 of FIG. 2) "2" 420d, "6" 435d, "11" 440d, "3" 445d, and "4" 450d can be displayed as experiencing an outage, while other terminal devices can be displayed as active. Because a group of terminal devices outages (e.g., "2" 420d, "6" 435d, "3" 445d, and "4" 450d) can be within the third nearest neighbor, the weighted factor lines (e.g., weighted factor 220 of FIG. 2) can be displayed between near terminal devices experiencing outages. It should be understood that weighted factors can be calculated from the perspective of each terminal device and can be represented by multiple originating arrows. Moreover, if the cluster sum of weighted factors exceeds a threshold, then a cluster outage 460c (e.g., cluster outage 225 FIG. 2) can be declared. In addition, since the cluster outage can be declared, and yet terminal device "5" 465d is still active in this example, an operator can diagnose that terminal device may be an illegally placed device and thus warrant further investigation.

In some implementations, other data can be displayed such as, for example, MER, FEC, power level, receive signal, and/or flapping. In other implementations, the data can be gathered and displayed in another format such as, for example, a table of data values instead of a graphical display.

Figure 5:
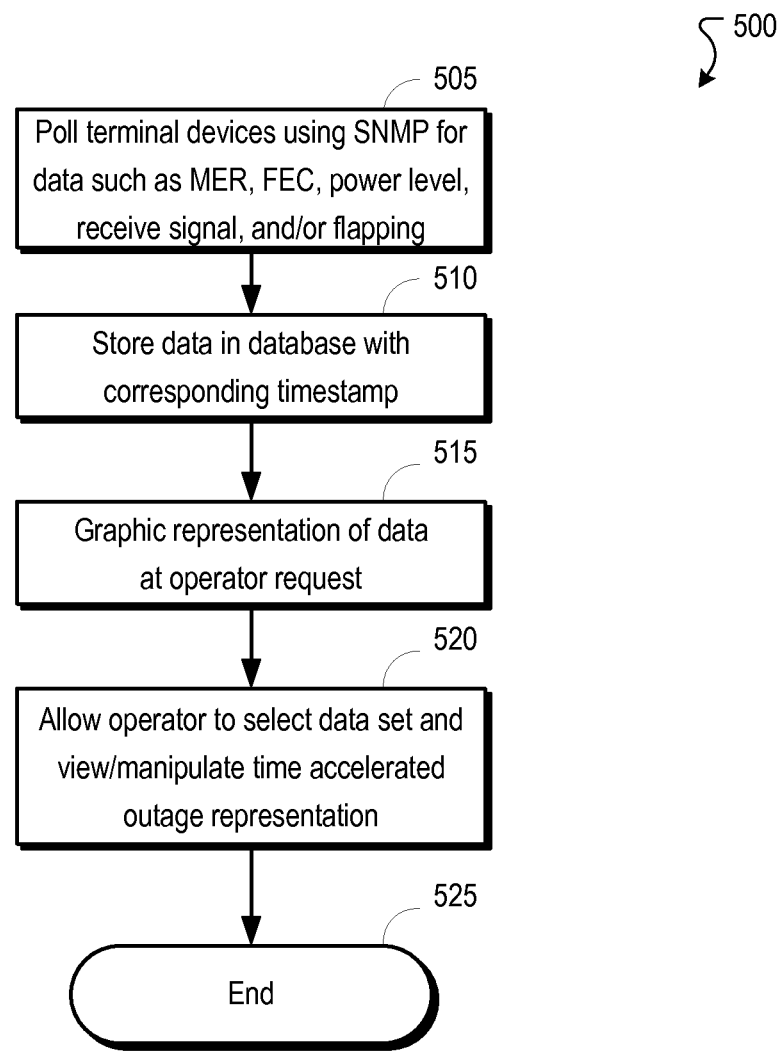
FIG. 5 is a flowchart illustrating an example process operable to provide time-stamped impairment data and visualization.

FIG. 5 is a flowchart illustrating an example process operable to provide time-stamped impairment data and visualization. The process 500 can begin at stage 505 when a computer device can poll terminal devices for data. The computing device (e.g., computing device 140 of FIG. 1) can poll terminal devices over the network (e.g., network 145 of FIG. 1) using a protocol such as, for example, simple network management protocol (SNMP), to retrieve data such as, for example, modulation error ratio (MER), forward error correction (FEC), power level, receive signal, and/or flapping. It should be understood that other data can be retrieved from terminal devices (e.g., terminal device 135a-b of FIG. 1 and block 210 of FIG. 2) and stored. In some implementations, another network protocol can be used to retrieve the data. In other implementations, the data can be manually entered by an operator.

At stage 510, the retrieved data can be stored in a database with a corresponding timestamp. The operation of database storage can be performed by the computing device (e.g., computing device 140 of FIG. 1). Moreover, the database can be a unit of the computing device. In some implementations, the data can be stored in memory for processing or another data storage device. In still further implementations, the data can be processed immediately without the need for storage. In some implementations, the timestamp can be retrieved from the terminal devices (e.g., terminal device 135a-b of FIG. 1 and block 210 of FIG. 2). In other implementations, the timestamp can be obtained from the computing device. In still further implementations, the timestamp can be obtained from an external networked device.

At stage 515, a graphic representation of the data can be displayed at the request of the operator. The graphic representation can be attached to the computing device (e.g., computing device 140 of FIG. 1). In some implementations, the graphic representation can be a map and/or picture. In other implementations, the graphic representation can be a table of values or a color scheme representing changing data values over time. It should be understood that a graphic representation is not necessary to use the time-stamped data.

At stage 520, the operator can select a data set and view and manipulate the time accelerated outage display. The manipulation can be performed by the computer device (e.g., computing device 140 of FIG. 1). In some implementations, the data set can include data such as, for example, MER, FEC, power level, receive signal, and flapping, among others. In some implementations, the time scale can be compressed from minutes to seconds. In other implementations, the time scale can be compressed from days to seconds. The time accelerated display can be manipulated by the operator with an input device such as, for example, the wheel on the computer mouse. In some implementations, the manipulation can occur with input from a keyboard. In other implementations, the time accelerated display can be played back linearly such as, for example, a time accelerated (e.g., time lapse) evolving weather map. The process 500 ends at stage 525.

Figure 6:
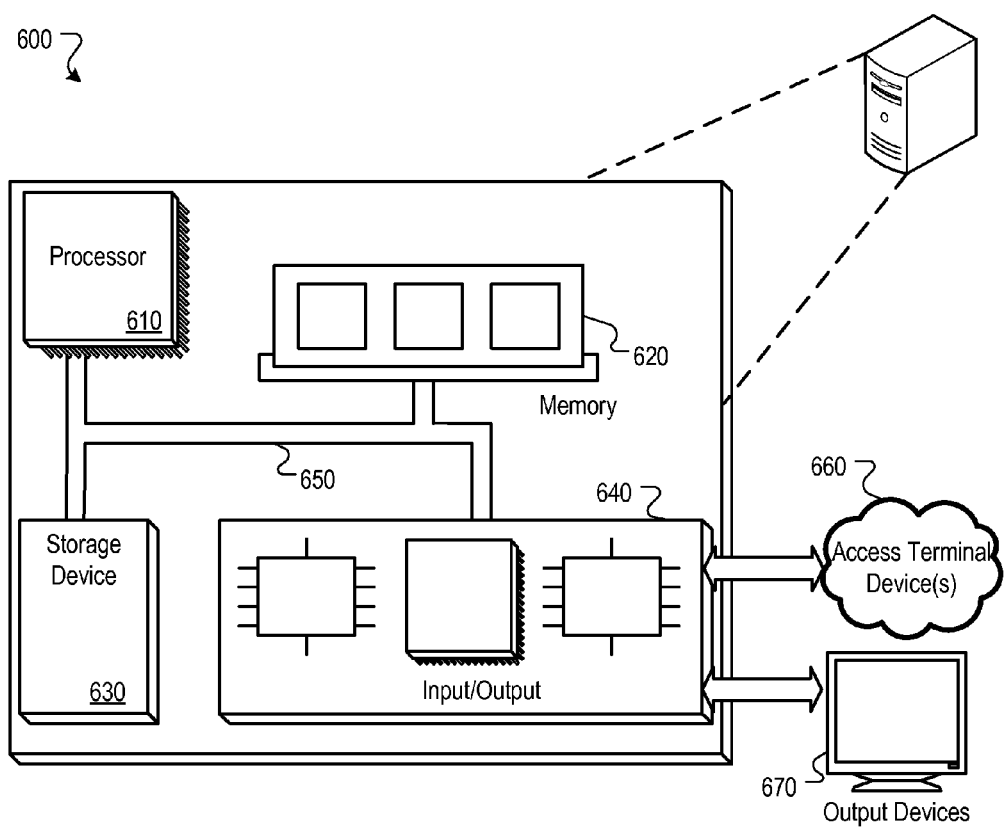
FIG. 6 is a block diagram of a computer device operable to provide improved impairment discovery.

FIG. 6 is a block diagram of a computer device operable to provide improved impairment discovery. In some implementations, the computing device (i.e., computing device 140 of FIG. 1) can execute a portion or all of the cluster outage detection. In other implementations, the computing device can execute a portion of the time-stamped outage data and visualization. It should be understood that many different kinds of network devices (e.g., including network hubs, bridges, routers, edge termination devices, etc.) can implement cluster outage detection and/or time-stamped outage data and visualization.

The device (i.e., computing device 140 of FIG. 1) 600 can include a processor 610, a memory 620, a storage device 630, and an input/output device 640. Each of the components 610, 620, 630, and 640 can, for example, be interconnected using a system bus 650. The processor 610 is capable of processing instructions for execution within the device 600. In one implementation, the processor 610 is a single-threaded processor. In another implementation, the processor 610 is a multi-threaded processor. The processor 610 is capable of processing instructions stored in the memory 620 or on the storage device 630.

The memory 620 stores information within the device 600. In one implementation, the memory 620 is a computer-readable medium. In some implementation, the memory 620 is a volatile memory unit. In another implementation, the memory 620 is a non-volatile memory unit.

In some implementations, the storage device 630 is capable of providing mass storage for the device 600. In one implementation, the storage device 630 is a computer-readable medium. In various different implementations, the storage device 630 can, for example, include a hard disk device, an optical disk device, flash memory or some other large capacity storage device.

The input/output device 640 provides input/output operations for the device 600. In one implementation, the input/output device 640 can include one or more of a plain old telephone interface (e.g., an RJ11 connector), a network interface device, e.g., an Ethernet card, a serial communication device, e.g., and RS-232 port, and/or a wireless interface device, e.g., and 802.11 card. In another implementation, the input/output device can include driver devices configured to receive input data and send output data to other input/output devices, such as one or more CPE devices (e.g., set top box, cable modem, etc.) or other terminal device via a network (i.e., IP or other Network(s) 145 of FIG. 1) 660. In another implementation, the input/output device can include driver devices configured to receive input data and send output data to other input/output devices (e.g., a computer display 670).

The computer device of this disclosure, and components thereof, can be realized by instructions that upon execution cause one or more processing devices to carry out the processes and functions described above. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, i.e., one or more modules of computer program instructions encoded on a tangible program carrier for execution by, or to control the operation of, data processing apparatus. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "system processor" encompasses all apparatus, devices, and machines for processing data, including by way of example a programmable processor, a computer, or multiple processors or computers. The system processor can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The elements of a computer typically include a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile communications device, a telephone, a cable modem, a set-top box, a mobile audio or video player, or a game console, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with an operator, embodiments of the subject matter described in this specification can be operable to interface with a computing device having a display, e.g., a CRT (cathode ray tube) or LCD (liquid crystal display) monitor, for displaying information to the operator and a keyboard and a pointing device, e.g., a mouse or a trackball, by which the operator can provide input to the computer. Other kinds of devices can be used to provide for interaction with an operator as well; for example, feedback provided to the operator can be any form of sensory feedback, e.g., visual feedback, auditory feedback, or tactile feedback; and input from the operator can be received in any form, including acoustic, speech, or tactile input.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. Other embodiments are within the scope of the following claims. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing may be advantageous.

What is claimed is:

1. A computer-implemented method, comprising:
    detecting impairments in a network comprising a plurality of impaired broadband terminal devices based on information received through a network interface from the plurality of broadband terminal devices including timestamps and geographic location of impairments;
    calculating a weighting factor for the detected impairments based on a volume of the broadband terminal devices affected by the detected impairments and a geographic distance relative to another broadband terminal device via a processor;
    automatically determining a cluster outage based on a sum of weighting factors within the geographic area via a processor, the cluster outage being identified based upon identifying that the detected impairments exceed a threshold density as compared to the calculated weighting factor; and
    displaying the cluster outage on a geographic map along with a progress bar being operable to be advanced and reversed by a technician to assist in analyzing the cluster outage over time by showing historical cluster outage information and detected impairments on the geographic map.

2. The computer-implemented method of claim 1, wherein determining the cluster outage is based on one or more arithmetic operations.

3. The computer-implemented method of claim 1, wherein determining the cluster outage is based on comparing the sum of weighted factors with a threshold value.

4. The computer-implemented method of claim 2, wherein determining the geographic distance is based on latitude and longitude coordinates associated with the broadband terminal device.

5. The computer-implemented method of claim 2, wherein calculating the weighted factor changes based on broadband device density within a geographic area.

6. The computer-implemented method of claim 4, wherein calculating the weighted factor changes based on broadband device density within a geographic area.

7. The computer-implemented method of claim 3, wherein determining the geographic distance is based on latitude and longitude coordinates.

8. The computer-implemented method of claim 3, wherein calculating the weighted factor changes based on broadband device density within a geographic area.

9. The computer-implemented method of claim 7, wherein calculating the weighted factor changes based on broadband device density within a geographic area.

10. The computer-implemented method of claim 1, wherein information includes a lack of response from the broadband terminal device.

11. A computer-implemented method comprising:
    detecting broadband terminal device outage impairments based on information received through a network interface from a plurality of broadband terminal devices;
    associating detected broadband terminal device outage impairments with respective timestamps and geographic locations via a processor;
    calculating a weighting factor based on a volume of the broadband terminal devices affected by the outage and a geographic distance relative to another broadband terminal device via a processor;
    automatically identifying cluster outages based on a sum of weighting factors within the geographic area via a processor, the cluster outages being identified based upon identifying the outages exceeding a threshold density as compared to the calculated weighting factor;
    displaying the broadband terminal device outage impairment and the cluster outages on a map via a processor and display, the processor and display being further operable to provide a progress bar showing advancement of the cluster outages over time by inclusion of historical cluster and device outage impairment information on the map when a user actuates a progress bar.

12. The computer-implemented method of claim 11, wherein the timestamp display is accelerated with the progress bar.

13. The computer-implemented method of claim 11, wherein the timestamp display is accelerated with a configurable check box.

14. The computer-implemented method of claim 11, wherein the timestamp display is accelerated with a computer mouse wheel.

15. A computer-implemented method comprising:
receiving broadband terminal device diagnostic information received through a network interface from a plurality of broadband terminal devices;
associating the broadband terminal device diagnostic information received from the plurality of broadband terminal devices with a geographic location via a processor;
storing the broadband terminal device diagnostic information along with timestamp information to a historic diagnostic information database, the timestamp information identifying a time at which the diagnostic information was collected; and
automatically identifying geographic clusters of broadband terminal devices having impairments, the identification being based on a plurality of impaired broadband terminal devices being detected above a threshold density within a particular geographic area;
displaying the broadband terminal device diagnostic information associated with a corresponding timestamp on a map via a processor and display, the display including a progress bar operable enable a technician to analyze diagnostic information by advancing and regressing a time associated with the displayed broadband terminal diagnostic information retrieved from the historic diagnostic information database, the display further including highlighting of the identified geographic clusters of broadband devices having impairments associated with a respective time displayed by the progress bar and the identified geographic clusters being operable to be advanced or regressed based upon actuation of the progress bar to reflect impairment density at the respective time.

16. The computer-implemented method of claim 15, wherein the broadband terminal device diagnostic information comprises a modulation error ratio.

17. The computer-implemented method of claim 15, wherein the broadband terminal device diagnostic information comprises forward error correction.

18. The computer-implemented method of claim 15, wherein the broadband terminal device diagnostic information comprises a power level.

19. The computer-implemented method of claim 15, wherein the broadband terminal device diagnostic information comprises a receive signal strength.

20. The computer-implemented method of claim 15, wherein the broadband terminal device diagnostic information comprises flapping.

\* \* \* \* \*